United States Patent
Baek et al.

(10) Patent No.: US 11,050,165 B2
(45) Date of Patent: *Jun. 29, 2021

(54) MODULE COMPRISING ANTENNA AND RF ELEMENT, AND BASE STATION INCLUDING SAME

(71) Applicant: Samsung Electronics Co., Ltd., Suwon-si (KR)

(72) Inventors: Kwanghyun Baek, Suwon-si (KR); Seungtae Ko, Suwon-si (KR); Kijoon Kim, Suwon-si (KR); Juho Son, Suwon-si (KR); Sangho Lee, Suwon-si (KR); Youngju Lee, Suwon-si (KR); Jungyub Lee, Suwon-si (KR); Yonghun Cheon, Suwon-si (KR); Dohyuk Ha, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/062,990

(22) Filed: Oct. 5, 2020

(65) Prior Publication Data

US 2021/0126379 A1 Apr. 29, 2021

Related U.S. Application Data

(63) Continuation of application No. 16/906,476, filed on Jun. 19, 2020, now Pat. No. 10,797,405, which is a
(Continued)

(30) Foreign Application Priority Data

Dec. 19, 2017 (KR) .................. 10-2017-0175064

(51) Int. Cl.
*H01Q 21/06* (2006.01)
*H01Q 1/24* (2006.01)
(Continued)

(52) U.S. Cl.
CPC .......... *H01Q 21/065* (2013.01); *H01Q 1/246* (2013.01); *H01Q 1/42* (2013.01); *H04B 7/0413* (2013.01);
(Continued)

(58) Field of Classification Search
CPC ........ H01Q 1/2283; H01Q 1/246; H01Q 1/42; H01Q 19/005; H01Q 21/065;
(Continued)

(56) References Cited

U.S. PATENT DOCUMENTS 6,512,675 B1 1/2003 Tarter et al.
7,541,986 B2 6/2009 Park
(Continued)

FOREIGN PATENT DOCUMENTS

EP 3 621 154 A1 3/2020
JP 2001-283178 A 10/2001
(Continued)

OTHER PUBLICATIONS

Claims dated Oct. 6, 2020 in U.S. Appl. No. 17/063,918.*
(Continued)

*Primary Examiner* — Robert Karacsony
(74) *Attorney, Agent, or Firm* — Jefferson IP Law, LLP

(57) ABSTRACT

A communication method and system for converging a 5th-Generation (5G) communication system for supporting higher data rates beyond a 4th-Generation (4G) system with a technology for Internet of Things (IoT) are provided. The disclosure may be applied to intelligent services based on the 5G communication technology and the IoT-related technology, such as smart home, smart building, smart city, smart car, connected car, health care, digital education, smart retail, security and safety services. According to the disclosure, an antenna module includes a first substrate layer on which at least one substrate is stacked; an antenna
(Continued)

coupled to an upper end surface of the first substrate layer; a second substrate layer having an upper end surface coupled to a lower end surface of the first substrate layer and on which at least one substrate is stacked; and a radio frequency (RF) element coupled to a lower end surface of the second substrate layer.

20 Claims, 13 Drawing Sheets

Related U.S. Application Data continuation of application No. PCT/KR2018/016264, filed on Dec. 19, 2018.

(51) Int. Cl.
  *H01Q 1/42* (2006.01)
  *H05K 1/18* (2006.01)
  *H05K 9/00* (2006.01)
  *H04B 7/0413* (2017.01)

(52) U.S. Cl.
  CPC .......... *H05K 1/181* (2013.01); *H05K 9/0049* (2013.01); *H05K 2201/042* (2013.01); *H05K 2201/10015* (2013.01); *H05K 2201/10098* (2013.01); *H05K 2201/10719* (2013.01); *H05K 2201/10734* (2013.01)

(58) Field of Classification Search
  CPC ............. H01Q 21/0075; H04B 7/0413; H05K 1/0201; H05K 1/0212; H05K 1/0237; H05K 1/0243; H05K 1/025; H05K 1/0271; H05K 1/141; H05K 1/142; H05K 1/144; H05K 1/16; H05K 1/181; H05K 9/0049; H05K 2201/042; H05K 2201/10015; H05K 2201/10098; H05K 2201/10719; H05K 2201/10734
  See application file for complete search history.

(56) References Cited

U.S. PATENT DOCUMENTS

| | | | |
|---|---|---|---|
| 7,675,465 B2 | 3/2010 | Doan et al. | |
| 8,411,444 B2 | 4/2013 | Gaynes et al. | |
| 8,587,482 B2 | 11/2013 | Liu | |
| 8,648,454 B2 | 2/2014 | Liu et al. | |
| 9,196,951 B2 | 11/2015 | Baks et al. | |
| 9,337,526 B2 | 5/2016 | Hong et al. | |
| 9,742,077 B2 | 8/2017 | Pan | |
| 9,787,809 B2 | 10/2017 | Jeong | |
| 9,806,422 B2 | 10/2017 | Garcia et al. | |
| 10,056,922 B1 | 8/2018 | Tsvelykh et al. | |
| 10,319,688 B2 | 6/2019 | Wolter et al. | |
| 10,490,879 B2 | 11/2019 | Baek et al. | |
| 10,566,298 B2 | 2/2020 | Dalmia et al. | |
| 10,680,332 B1 | 6/2020 | Li | |
| 10,797,405 B1 * | 10/2020 | Baek | H01Q 1/42 |
| 2006/0061511 A1 | 3/2006 | Enoki et al. | |
| 2006/0160498 A1 | 7/2006 | Sudo | |
| 2007/0029667 A1 | 2/2007 | Fujii et al. | |
| 2007/0069369 A1 | 3/2007 | Hou et al. | |
| 2010/0327068 A1 | 12/2010 | Chen et al. | |
| 2013/0207274 A1 | 8/2013 | Liu et al. | |
| 2014/0015728 A1 | 1/2014 | Anguera Pros et al. | |
| 2014/0361946 A1 | 12/2014 | Ganchrow et al. | |
| 2015/0325925 A1 | 11/2015 | Kamgaing et al. | |
| 2016/0049723 A1 | 2/2016 | Baks et al. | |
| 2016/0240492 A1 | 8/2016 | Wolter et al. | |
| 2016/0306034 A1 | 10/2016 | Trotta et al. | |
| 2017/0155185 A1 | 6/2017 | Hong et al. | |
| 2018/0219272 A1 | 8/2018 | Baheti et al. | |
| 2019/0103682 A1 | 4/2019 | Thai et al. | |
| 2019/0252757 A1 | 8/2019 | Baek et al. | |
| 2019/0280368 A1 | 9/2019 | Khan et al. | |
| 2019/0377392 A1 | 12/2019 | Mani et al. | |
| 2020/0161766 A1 | 5/2020 | Liu et al. | |
| 2020/0303822 A1 | 9/2020 | Yao et al. | |

FOREIGN PATENT DOCUMENTS

| | | |
|---|---|---|
| JP | 2012-095121 A | 5/2012 |
| KR | 10-2005-0011561 A | 1/2005 |
| KR | 10-2013-0042909 A | 4/2013 |
| KR | 10-2016-0004720 A | 1/2016 |
| KR | 10-2016-0032144 A | 3/2016 |
| KR | 10-2016-0132649 A | 11/2016 |
| KR | 10-2017-0019973 A | 2/2017 |
| KR | 10-1833154 B1 | 4/2018 |
| WO | 2004/051790 A2 | 6/2004 |
| WO | 2017/171831 A1 | 10/2017 |
| WO | 2019/066924 A1 | 4/2019 |

OTHER PUBLICATIONS

Claims dated Oct. 6, 2020 in U.S. Appl. No. 17/063,929.*
Korean Office Action with English translation dated Oct. 22, 2020; Korean Appln. No. 10-2017-0175064.
European Search Report dated Nov. 13, 2020; European Appln. No. 18892022.7-1205 / 3694050 PCT/KR201816264.
U.S. Office Action dated Jan. 6, 2021; U.S. Appl. No. 17/063,918.
U.S. Office Action dated Jan. 6, 2021; U.S. Appl. No. 17/063,929.

* cited by examiner

MODULE COMPRISING ANTENNA AND RF ELEMENT, AND BASE STATION INCLUDING SAME

CROSS-REFERENCE TO RELATED APPLICATION(S)

This application is a continuation application of prior application Ser. No. 16/906,476, filed on Jun. 19, 2020, which will be issued as U.S. Pat. No. 10,797,405 on Oct. 6, 2020, which is an International application No. PCT/KR2018/016264, filed on Dec. 19, 2018, which was based on and claimed the benefit of a Korean patent application number 10-2017-0175064, filed on Dec. 19, 2017, in the Korean Intellectual Property Office, the disclosure of which is incorporated by reference herein in its entirety.

TECHNICAL FIELD

The disclosure relates to a structure of a module that may be mounted in a base station and a mobile device, including an antenna and an RF element.

BACKGROUND ART

To meet the demand for wireless data traffic having increased since deployment of 4th generation (4G) communication systems, efforts have been made to develop an improved 5th generation (5G) or pre-5G communication system. Therefore, the 5G or pre-5G communication system is also called a 'Beyond 4th generation (4G) Network' or a 'Post long term evolution (LTE) System'. The 5G communication system is considered to be implemented in higher frequency (mmWave) bands, e.g., 60 GHz bands, so as to accomplish higher data rates. To decrease propagation loss of the radio waves and increase the transmission distance, beamforming, massive multiple-input multiple-output (MIMO), Full Dimensional MIMO (FD-MIMO), array antenna, analog beam forming, and large-scale antenna techniques are discussed in 5G communication systems. In addition, in 5G communication systems, development for system network improvement is underway based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation, and the like. In the 5G system, Hybrid frequency shift keying (FSK) and quadrature amplitude modulation (QAM) Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology, have been developed.

In this regard, the Internet, which is a human centered connectivity network where humans generate and consume information, is now evolving into the Internet of Things (IoT) where distributed entities, such as things, exchange and process information without human intervention. The Internet of Everything (IoE), which is a combination of IoT technology and Big Data processing technology through connection with a cloud server, has emerged. As technology elements, such as "sensing technology", "wired/wireless communication and network infrastructure", "service interface technology", and "Security technology" have been demanded for IoT implementation, a sensor network, Machine-to-Machine (M2M) communication, Machine Type Communication (MTC), and so forth, have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services, through convergence and combination between existing Information Technology (IT) and various industrial applications.

In line with this, various attempts have been made to apply 5G communication systems to IoT networks. For example, technologies such as a sensor network, MTC, and M2M communication may be implemented by beamforming, MIMO, and array antennas. Application of a cloud RAN as the above-described Big Data processing technology may also be considered an example of convergence between the 5G technology and the IoT technology.

DISCLOSURE OF INVENTION

Technical Problem

A plurality of antennas and RF elements are mounted in a base station applied to the above-described 5G communication system. The antenna and the RF element may be coupled to a substrate, and a circuit wiring for connecting to the antenna, the RF element, and other circuit components may be formed inside the substrate.

That is, the number of required substrates varies according to a method of coupling and configuring the antenna, the RF element, and the substrate, and circuit stability of the antenna module may be determined based on this.

The disclosure may provide a device capable of miniaturizing an antenna module by minimizing the use of a substrate while improving circuit stability of an antenna module.

Solution to Problem

According to the disclosure, an antenna module includes a first substrate layer on which at least one substrate is stacked; an antenna coupled to an upper end surface of the first substrate layer; a second substrate layer having an upper end surface coupled to a lower end surface of the first substrate layer and on which at least one substrate is stacked; and a radio frequency (RF) element coupled to a lower end surface of the second substrate layer.

The antenna may be a patch antenna.

The antenna module may further include at least one capacitor coupled to the lower end surface of the second substrate layer.

The antenna module may further include a first cover coupled to the lower end surface of the first substrate layer to enclose the second substrate layer and the RF element.

The first cover may be configured with a shield can, and the first cover and the first substrate layer may be coupled through a shield can clip.

The RF element and the first cover may be coupled through a thermal interface material (TIM).

The antenna module may further include a radiator coupled to the lower end surface of the first substrate layer and a lower end surface of the first cover to absorb a heat emitted from the first substrate layer and the first cover.

A grid array may be formed at the lower end surface of the first substrate layer, and the first substrate layer and the second substrate layer may be conducted through the grid array.

The antenna module may further include a second cover enclosing the antenna at the upper end surface of the first substrate layer.

According to various embodiments of the disclosure, there is provided a base station including a package type module, wherein the package type module includes a first substrate layer on which at least one substrate is stacked; an antenna coupled to an upper end surface of the first substrate layer; a second substrate layer having an upper end surface coupled to a lower end surface of the first substrate layer and on which at least one substrate is stacked; and a radio frequency (RF) element coupled to a lower end surface of the second substrate layer.

The antenna may be a patch antenna.

The base station may further include at least one capacitor coupled to the lower end surface of the second substrate layer.

The base station may further include a first cover coupled to the lower end surface of the first substrate layer to enclose the second substrate layer and the RF element.

The first cover may be configured with a shield can, and the first cover and the first substrate layer may be coupled through a shield can clip.

The RF element and the first cover may be coupled through a thermal interface material (TIM).

The base station may further include a radiator coupled to the lower end surface of the first substrate layer and a lower end surface of the first cover to absorb a heat emitted from the first substrate layer and the first cover.

A grid array may be formed at the lower end surface of the first substrate layer, and the first substrate layer and the second substrate layer may be conducted through the grid array.

The base station may further include a second cover enclosing the antenna at the upper end surface of the first substrate layer.

Advantageous Effects of Invention

According to an embodiment disclosed in the disclosure, the number of substrates constituting an antenna module can be reduced; thus, an advantage can arise in terms of price competitiveness and miniaturization of the antenna module.

Further, because an antenna module structure according to the disclosure reduces the probability of progress failure by a force transferred in only one direction compared to the conventional antenna module structure, it can be more advantageous in terms of mass productivity and reliability.

Further, a heat generated in elements constituting the antenna module can be effectively emitted to the outside, thereby improving durability of the antenna module.

MODE FOR THE INVENTION

Figure 1:
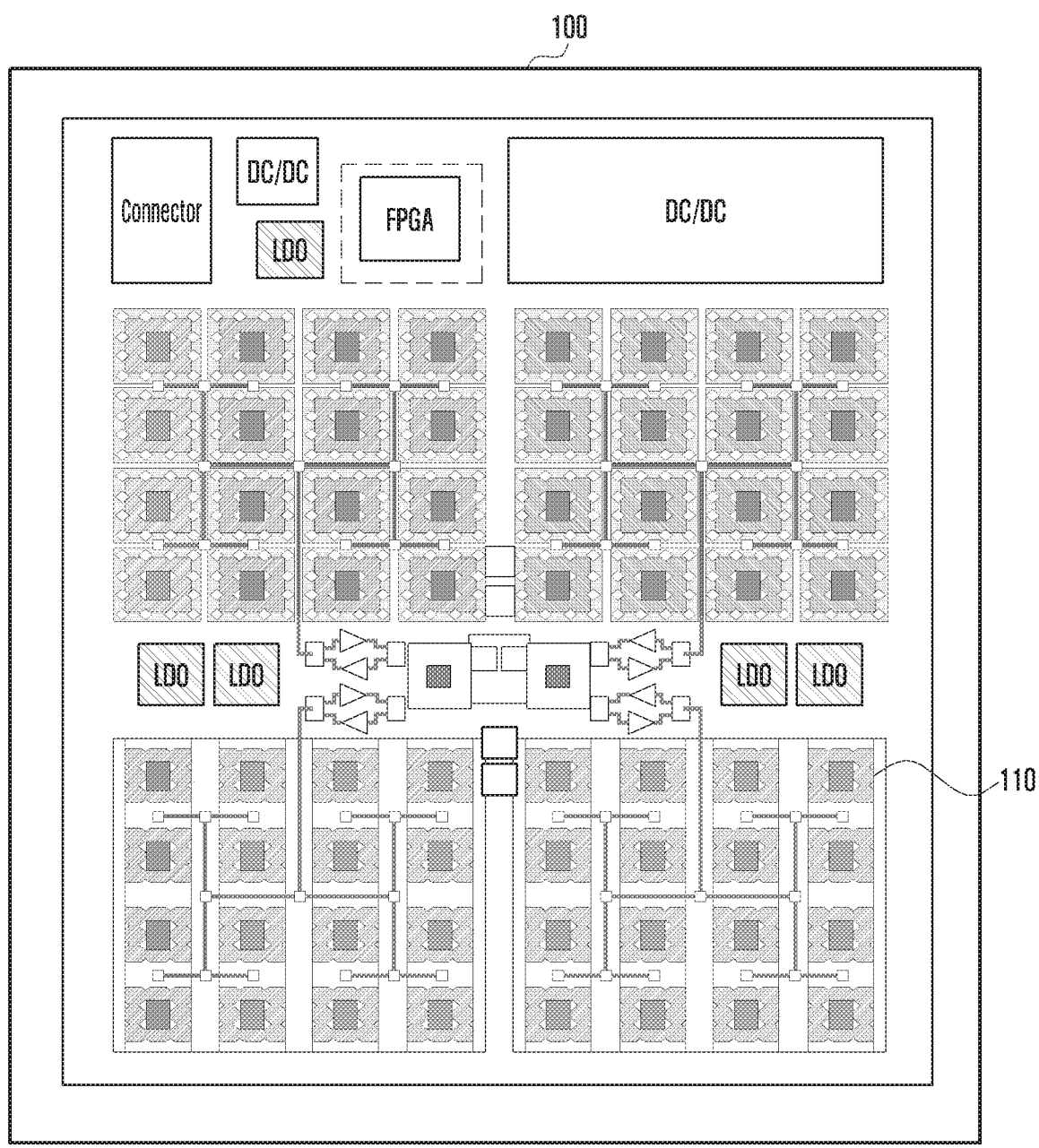
FIG. 1 is a diagram illustrating an embodiment of a package type module mounted in a base station.

When describing an embodiment in this specification, a description of technical contents well known in the art of the disclosure and not directly related to the disclosure will be omitted. This is to clearly describe the subject matter of the disclosure, without obscuring the subject matter, by omitting any unnecessary description.

Similarly, in the attached drawings, some components are shown in an exaggerated or schematic form or are omitted. Further, a size of each component does not entirely reflect an actual size. Like reference numerals designate like elements in the drawings.

These advantages and features of the disclosure and a method of accomplishing them will become more readily apparent from embodiments to be described in detail together with the accompanying drawings. However, the disclosure is not limited to the following embodiments, and it may be implemented in different forms, and the present embodiments enable the complete disclosure of the disclosure and are provided to enable complete knowledge of the scope of the disclosure to those skilled in the art, and the disclosure is defined by the scope of the claims. Like reference numerals designate like elements throughout the specification.

Herein, it may be understood that each block of a flowchart and combinations of the flowchart may be performed by computer program instructions. Because these computer program instructions may be mounted in a processor of a universal computer, a special computer, or other programmable data processing equipment, the instructions performed through a processor of a computer or other programmable data processing equipment generate a means that performs functions described in a block(s) of the flowchart. In order to implement a function with a specific method, because these computer program instructions may be stored at a computer available or computer readable memory that can direct a computer or other programmable data processing equipment, instructions stored at the computer available or computer readable memory may produce a production item including an instruction means that performs a function described in a block(s) of the flowchart. Because computer program instructions may be mounted on a computer or other programmable data processing equipment, a series of operation steps are performed on the computer or other programmable data processing equipment and generate a process executed with the computer, and instructions that perform the computer or other programmable data processing equipment may provide steps for executing functions described in a block(s) of the flowchart.

Further, each block may represent a portion of a module, segment, or code including at least one executable instruction for executing a specific logical function(s). Further, in several replaceable execution examples, it should be noted that functions described in blocks may be performed regardless of order. For example, two consecutively shown blocks may be substantially simultaneously performed or may be sometimes performed in reverse order according to a corresponding function.

In this case, a term '-unit' used in the present embodiment means a software or hardware component such as a field programmable gate array (FPGA) or an application specific integrated circuit (ASIC) and performs any function. However, "-unit" is not limited to software or hardware. The "-unit" may be configured to store at a storage medium that can address and be configured to reproduce at least one processor. Therefore, as an example, "-unit" includes, for example, components such as software components, object-oriented software components, class components, and task components, processes, functions, attributes, procedures, subroutines, segments of a program code, drivers, firmware, microcode, circuit, data, database, data structures, tables, arrays, and variables. A function provided within components and "-units" may be performed by coupling the smaller number of components and "-units" or by subdividing the components and "-units" into additional components and "-units". Further, components and "-units" may be implemented to reproduce at least one CPU within a device or a security multimedia card. Further, in an embodiment, '-unit' may include at least one processor.

FIG. 1 is a diagram illustrating an embodiment of a package type module mounted in a base station.

A base station according to the disclosure may be equipped with a package type module 100 illustrated in FIG. 1.

Specifically, the base station according to the disclosure may include a plurality of antenna modules 110. As an example, FIG. 1 discloses a package type module 100 including 64 antenna modules 110.

Further, the antenna module 110 may include a connector that provides power to the antenna module 110 and a DC/DC converter that converts a voltage of the power. Further, the package type module 100 according to the disclosure may include a field programmable gate array (FPGA).

The FPGA is a semiconductor element including a designable logic element and a programmable internal line. The designable logic element may be programmed by duplicating logic gates such as AND, OR, XOR, and NOT and more complex decoder functions. Further, the FPGA may further include a flip-flop or a memory.

The antenna module 110 may include a plurality of low dropout (LDO) regulators as illustrated in FIG. 1. The LDO regulator is a regulator having high efficiency when an output voltage is lower than an input voltage and the voltage difference between an input voltage and an output voltage is small, and may remove noise of the input power. Further, the LDO regulator may perform a function of stabilizing the circuit by positioning a dominant pole in the circuit because of low output impedance.

FIG. 1 discloses only a form in which 64 antenna modules 110 are mounted in one package type module 100 as an embodiment according to the disclosure, but the number of antenna modules mounted in one package type module 100 may be changed. Therefore, the scope of the disclosure should not be determined based on the number of antenna modules disclosed in FIG. 1.

Further, because a DC/DC FPGA, LDO, etc. constituting the package type module 100 in addition to the antenna module 110 may be added or deleted as necessary, the scope of the disclosure should not be limited by the above configurations.

Figure 2:
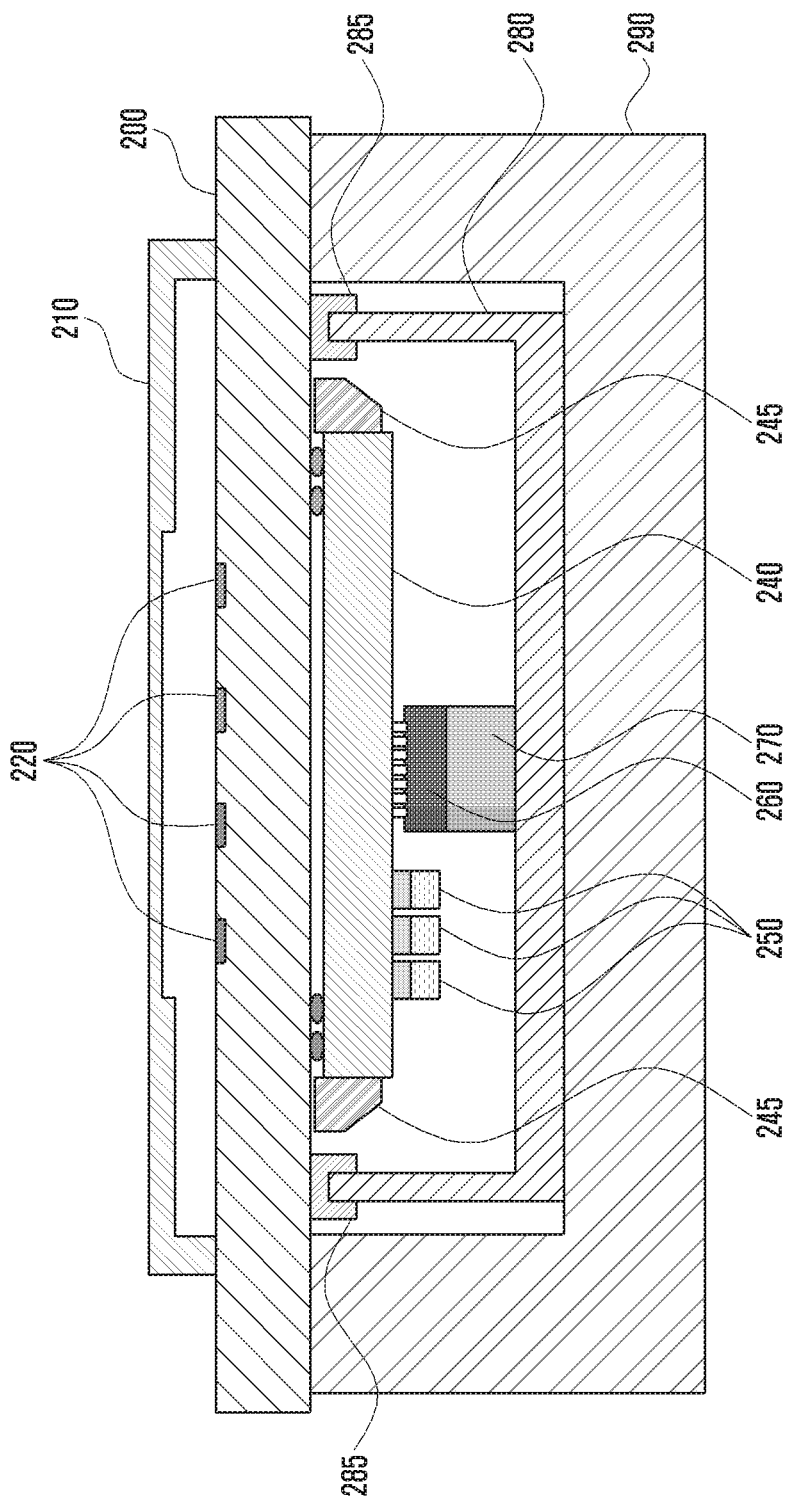
FIG. 2 is a diagram illustrating a configuration of an antenna module according to an embodiment of the disclosure.

FIG. 2 is a diagram illustrating a configuration of an antenna module according to an embodiment of the disclosure.

The antenna module according to the disclosure may include a first substrate layer 200 on which at least one substrate is stacked, an antenna 220 coupled to an upper end surface of the first substrate layer, a second substrate layer 240 having an upper end surface coupled to a lower end surface of the first substrate layer 200 and on which at least one substrate is stacked, and a radio frequency (RF) element 260 coupled to a lower end surface of the second substrate layer 240.

The first substrate layer 200 and the second substrate layer 240 mean a substrate in which a circuit is formed, and may generally include a printed circuit board (PCB) and a printed wiring board (PWB). The first substrate layer 200 and the second substrate layer 240 may form a circuit for connecting each circuit component in a surface or the inside of the substrate based on the designed circuit.

The first substrate layer 200 to which the antenna 220 is coupled may be a main board of the antenna module according to the disclosure. As illustrated in FIG. 1, the antenna 220 and other circuit components (e.g., LDO, DC/DC, etc. may be included therein) may be electrically conducted through a wiring formed in the first substrate layer 200.

The first substrate layer 200 may be configured by stacking at least one substrate, and the first substrate layer 200 according to the disclosure may configure only a circuit wiring for connecting an antenna and each circuit component, and the second substrate layer 240 may configure only a circuit wiring for connecting the RF element and each circuit component.

Accordingly, according to the disclosure, the number of substrates configuring the first substrate layer 200 may be reduced than that in the prior art, thereby reducing a thickness and a material cost of the first substrate layer, and the circuit wiring inside the first substrate layer may be further simplified and thus a loss by internal resistance of the substrate may be reduced.

A plurality of antennas 220 may be disposed in the first substrate layer 200 according to the disclosure. For example, as illustrated in FIG. 1, four antennas 220 may be spaced apart at regular intervals to be disposed at an upper end surface of the first substrate layer 200.

According to the disclosure, the antenna 220 may be configured as a patch antenna. The patch antenna may be formed through a method of forming a specific metal shape on the circuit board, and according to the disclosure, by forming a metal shape at an upper end surface of the first substrate layer 200, the antenna 220 may be configured.

The second substrate layer 240 is a substrate layer for a circuit wiring between the RF element 260 and other circuit components as described above. The second substrate layer 240 may also be configured by stacking a plurality of substrates as in the first substrate layer 200. However, because the second substrate layer 240 does not correspond to the main board, the number of substrates stacked on the second substrate layer 240 may be smaller than that of substrates stacked on the first substrate layer 200.

The upper end surface of the second substrate layer 240 may be coupled to the lower end surface of the first substrate layer 200 in various ways, and FIG. 1 discloses a method of coupling the first substrate layer 200 and the second substrate layer 240 by disposing a sealing ring 245 at both side ends of the second substrate layer 240.

In order to electrically connect the antenna 220 or other circuit components and the RF element 260, the first substrate layer 200 and the second substrate layer 240 should be electrically conducted. Therefore, in the disclosure, by forming a grid array at the lower end surface of the first substrate layer 200, the first substrate layer 200 and the second substrate layer 240 may be conducted through the grid array.

The grid array may representatively include a land grid array (LGA) and a ball grid array (BGA). The LGA is a method suitable for modules requiring a high-speed processing speed because a lead inductance is small in a method of disposing chip electrodes in the form of an array at the lower end surface of the substrate. However, the BGA is a method suitable for modules requiring a large number of pins in a method of disposing a solder in an array form at the lower end surface of the substrate.

The grid array should not be formed by biasing to only a portion of the lower end surface of the first substrate layer 200. When a heat occurs in the antenna module, a force may be applied to the first substrate layer 200 and the second substrate layer 240 through mutual directions.

In this case, when the grid array is not uniformly distributed, the grid array may be damaged by the force; thus, the electrical connection relationship between the first substrate layer 200 and the second substrate layer 240 may be broken.

Therefore, in order to prevent such a loss in advance, the grid array may be uniformly formed at a lower end surface of the first substrate layer 200, and FIG. 2 illustrates, for example, a case in which the grid array is uniformly formed at both ends of a surface in which the first substrate layer 200 and the second substrate layer 240 contact.

A lower end surface of the second substrate layer 240 may include a plurality of capacitors 250, as illustrated in FIG. 1. Through the capacitor 250, noise generated in an internal circuit of the second substrate layer can be removed and stability of the circuit can be secured.

Because the capacitor 250 is disposed at the substrate layer as in the above-described antenna 220, the capacitor 250 may be configured as a surface mount device (SMD) type capacitor.

According to the disclosure, as illustrated in FIG. 2, a first cover 280 coupled to a lower end surface of the first substrate layer 200 to enclose the second substrate layer 240 and the RF element 260 may be further included.

The first cover 280 may be configured with a shield can. That is, the first cover 280 may shield electromagnetic waves generated in the RF element 260 and the second substrate layer 240 existing inside the first cover, and by removing noise generated in a flexible circuit board of the second substrate layer 240, the influence in which peripheral components receive from electromagnetic waves may be minimized.

The first cover 280 may be coupled to the lower end surface of the first substrate layer 200 through a shield can clip 285 having the same electromagnetic shielding property as that thereof, and the shield can clip may be disposed at both ends in which the first cover 280 and the first substrate layer 200 are coupled.

The RF element 260 coupled to the lower end surface of the second substrate layer 240 means a high-frequency chip for wireless communication and may include an RFIC chip in which an RF circuit is implemented on one semiconductor chip using an active element and a passive element. Accordingly, the RF element may include an amplifier, a transmitter, a receiver, and a synthesizer.

Because the RF element 260 includes a plurality of electrical elements, as described above, a heat may be generated because of an operation of the element, and the element may be damaged by heat generation, and as described above, a pressure may be applied to the second substrate layer 240.

Therefore, it is necessary to emit a heat generated in the RF element 260 to the outside, but the disclosure discloses a method of emitting a heat generated in an RF element to the outside of an antenna module by disposing a thermal interface material (TIM) 270 between the RF element and the first cover.

That is, a heat generated in the RF element 260 through the TIM may be transferred to the first cover 280, and the heat transferred to the first cover 280 may be transferred to a lower end surface of the first substrate layer 200 and a heat sink 290 coupled to the lower end surface of the first cover 280 to be emitted to the outside of the antenna module.

At an upper end surface of the first substrate layer 200, a second cover 210 formed to enclose the antenna 220 may be disposed. The second cover may be disposed in a direction in which the antenna 220 emits a beam, as illustrated in FIG. 2.

Therefore, unlike the first cover (because the first cover is primarily used for electromagnetic shielding, it may be generally preferable to form the first cover with a metal), it may be preferable to form the second cover 210 with a material such as plastic that does not affect a beam emitted through the antenna 220.

FIG. 2 discloses only one embodiment of an antenna module according to the disclosure, and the scope of the disclosure should not be limited to the form and configuration illustrated in FIG. 2.

Figure 3:
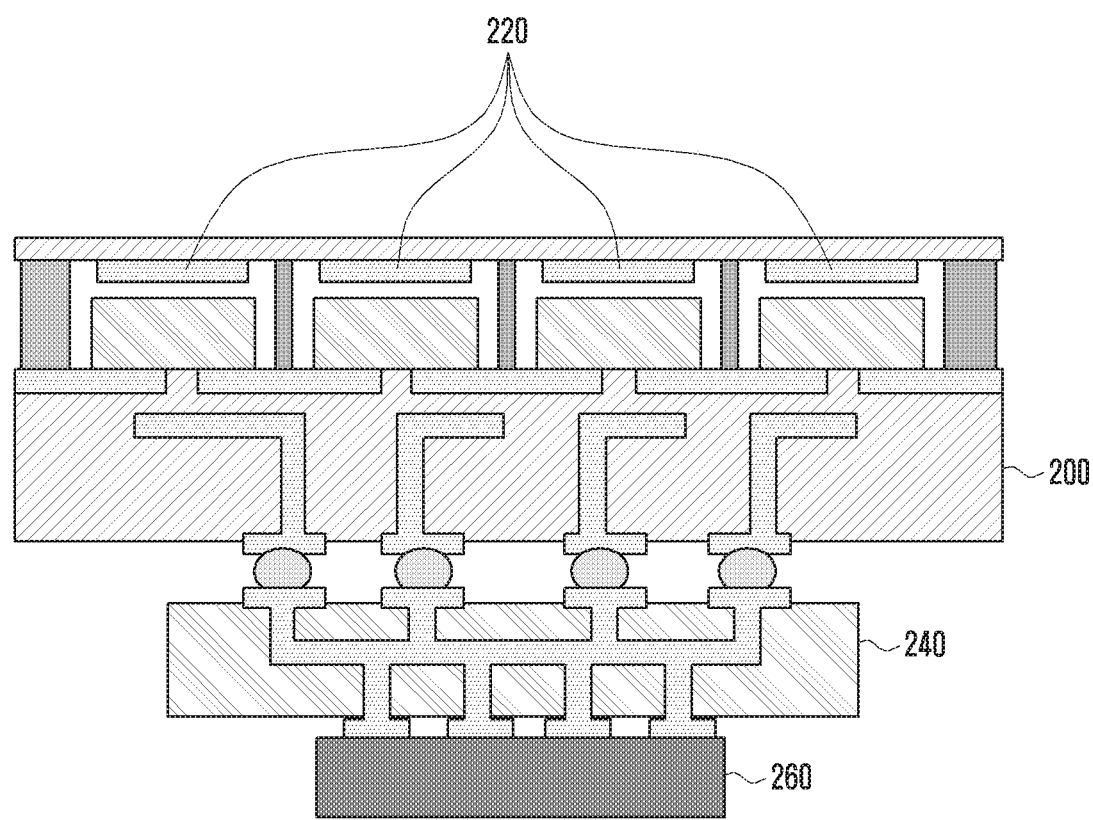
FIG. 3 is a diagram illustrating an internal configuration of an antenna module substrate layer according to an embodiment of the disclosure.

FIG. 3 is a diagram illustrating an internal configuration of an antenna module substrate layer according to an embodiment of the disclosure.

As described above, the RF element 260 and the antenna 220 may be electrically connected through the first substrate layer 200 and the second substrate layer 240. FIG. 3, for example, illustrates a case in which four antennas 220 are disposed at an upper end surface of the first substrate layer 200 and in which the first substrate layer 200 and the second substrate layer 240 are coupled in a BGA manner.

In this case, a signal transmitted through the antenna 220 may be transferred to the RF element 260 by a wiring formed in a pattern shape within the first substrate layer 200 and the second substrate layer 240, and a signal generated through the RF element 260 may be radiated to the outside through the antenna 220.

In the base station including a package type module according to the disclosure, the package type module may include a first substrate layer on which at least one substrate is stacked, an antenna coupled to an upper end surface of the first substrate layer, a second substrate layer having an upper end surface coupled to a lower end surface of the first substrate layer and on which at least one substrate is stacked, and a radio frequency (RF) element coupled to a lower end surface of the second substrate layer.

The antenna may be a patch antenna, and the base station may further include at least one capacitor coupled to the lower end surface of the second substrate layer.

Further, the base station may further include a first cover coupled to the lower end surface of the first substrate layer to enclose the second substrate layer and the RF element, and the first cover may be configured with a shield can, and the first cover and the first substrate layer may be coupled through a shield can clip.

The RF element and the first cover may be coupled through a thermal interface material (TIM), and the base station may further include a radiator coupled to the lower end surface of the first substrate layer and a lower end surface of the first cover to absorb a heat emitted from the first substrate layer and the first cover.

A grid array may be formed at the lower end surface of the first substrate layer, and the first substrate layer and the second substrate layer may be conducted through the grid array, and the base station may further include a second cover enclosing the antenna at the upper end surface of the first substrate layer.

Figure 4:
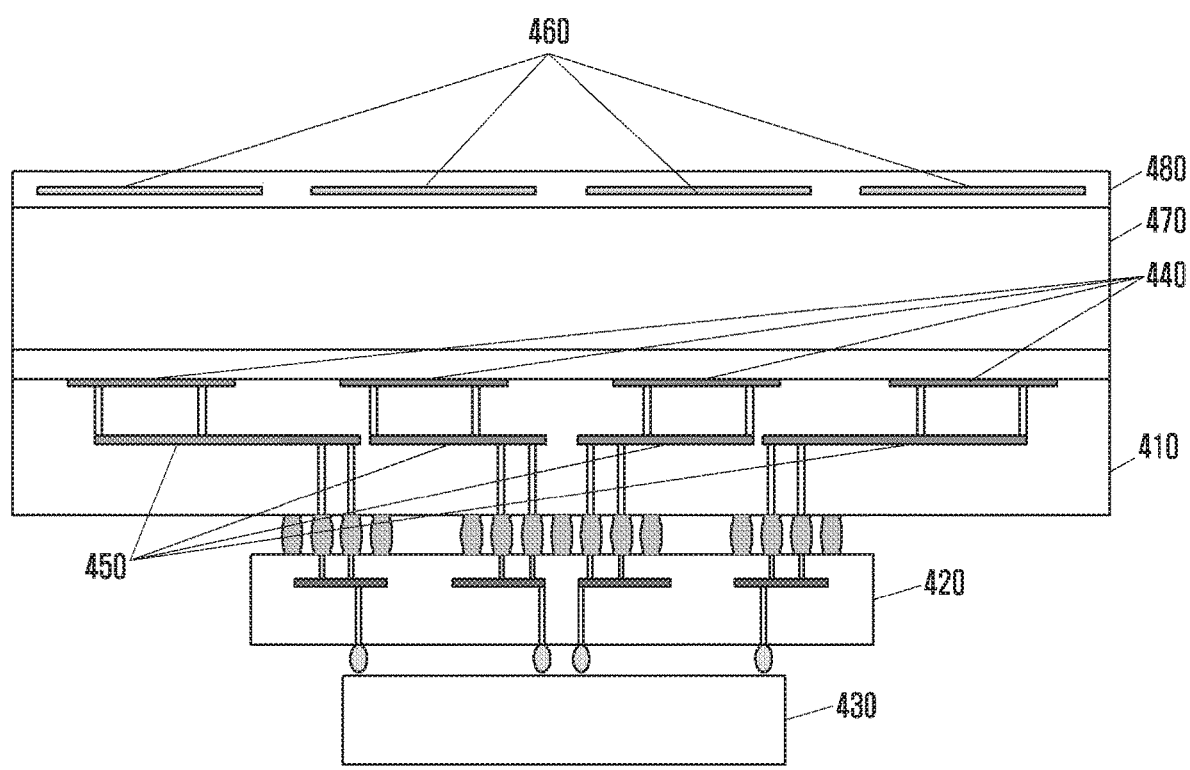
FIG. 4 is a diagram illustrating a side surface of an antenna module according to an embodiment of the disclosure.

FIG. 4 is a diagram illustrating a side surface of an antenna module according to an embodiment of the disclosure.

According to one embodiment, the antenna module may include a first substrate layer 410 on which at least one substrate is stacked, a second substrate layer 420 having an upper end surface coupled to a lower end surface of the first substrate layer 410 and on which at least one substrate is stacked, and an RF element coupled to a lower end surface of the second substrate layer 420.

According to one embodiment, the first substrate layer 410 may be a main board of the antenna module. According to various embodiments, the first substrate layer 410 and the second substrate layer 420 may be electrically connected through a land grid array (LGA) or a ball grid array (BGA).

According to an embodiment, the upper end surface of the first substrate layer 410 may include at least one antenna array 440 that enables radio waves to be emitted to the upper end surface of the first substrate layer 410. According to various embodiments, an electrical signal supplied from the second substrate layer 420 through the LGA or the BGA may be supplied to the at least one antenna array 440 through a feed line 450 formed inside the first substrate layer 410.

According to an embodiment, the electrical signal may be an electrical signal supplied from an RF element 430 in order to emit radio waves of a specific frequency. According to various embodiments, by supplying an electrical signal supplied from the RF element 430 to at least one antenna array 440 through the feed line 450 provided inside the second substrate layer 420 and the first substrate layer 410, the antenna module may perform beamforming. For example, the at least one antenna 440, having received the electrical signal from the RF element 430 through the feed line 450 may emit horizontal polarization or vertical polarization to form a beam in a specific direction.

According to an embodiment, the RF element 430 may be disposed at a lower end surface of the second substrate layer 420 to supply an electrical signal (or RF signal) to the second substrate layer 420. According to various embodiments, the lower end surface of the second substrate layer 420 and the RF element 430 may be electrically connected through soldering.

According to an embodiment, impedance matching of a line formed for transmission of an electrical signal may be implemented within the second substrate layer 420 and the feed line 450 formed inside the first substrate layer 410. According to various embodiments, by implementing impedance matching of the first substrate layer 410 and the second substrate layer 420 through the BGA, a beam of a specific frequency band may be emitted through the antenna array 440.

According to one embodiment, the upper end surface of the antenna array 400 may include a spacer 470 including a metallic material, and a top antenna array 460 may be disposed at the upper end surface of the spacer 470. According to various embodiments, by disposing apart the antenna array 400 and the top antenna array 460 by a specific distance through the spacer 470, a frequency band of radio waves emitted through the antenna module may be improved. According to an embodiment, the top antenna array 460 may be disposed inside a third substrate layer 480. For example, the third substrate layer 480 may be a flexible printed circuit board (FPCB).

Figure 5A:
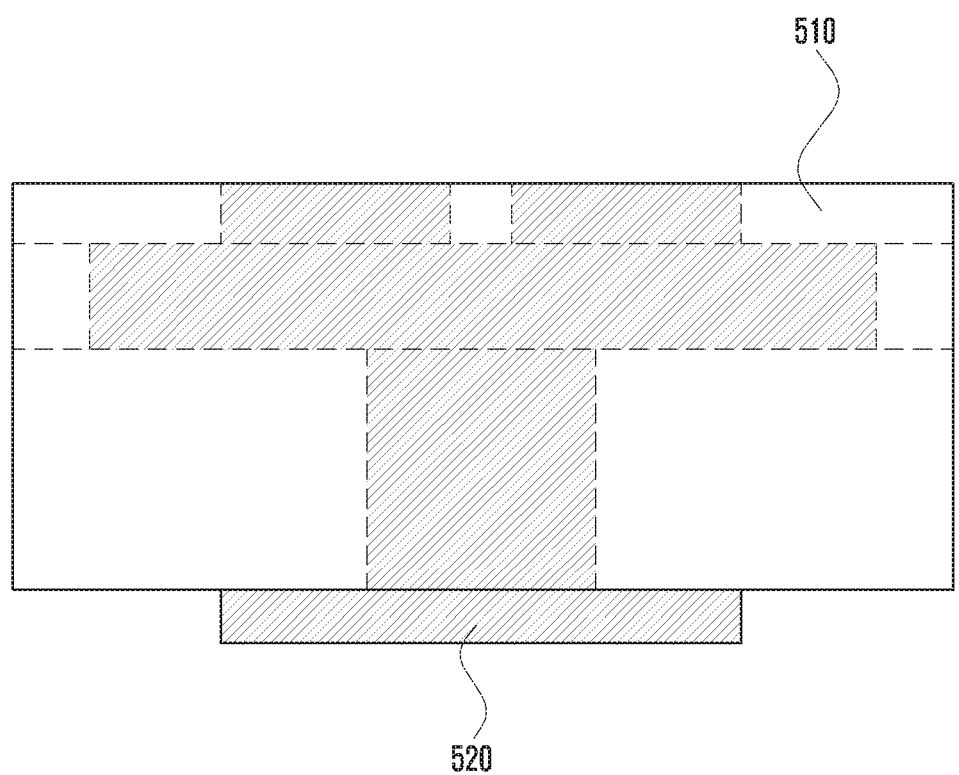
FIG. 5A is a side view of a first substrate layer according to an embodiment of the disclosure.

FIG. 5A is a side view of a first substrate layer according to an embodiment of the disclosure.

According to an embodiment, an RF element 520 may be disposed at a lower end surface of a first substrate layer 510. According to various embodiments, the RF element 520 and the first substrate layer 510 may be coupled in a soldering manner.

According to an embodiment, the RF element 520 may supply an RF signal for emitting radio waves to the first substrate layer 510. According to various embodiments, the RF signal supplied to the lower end surface of the first substrate layer 510 may be transmitted to an upper end surface of the first substrate layer 510 through a wiring inside the first substrate layer 510.

Figure 5B:
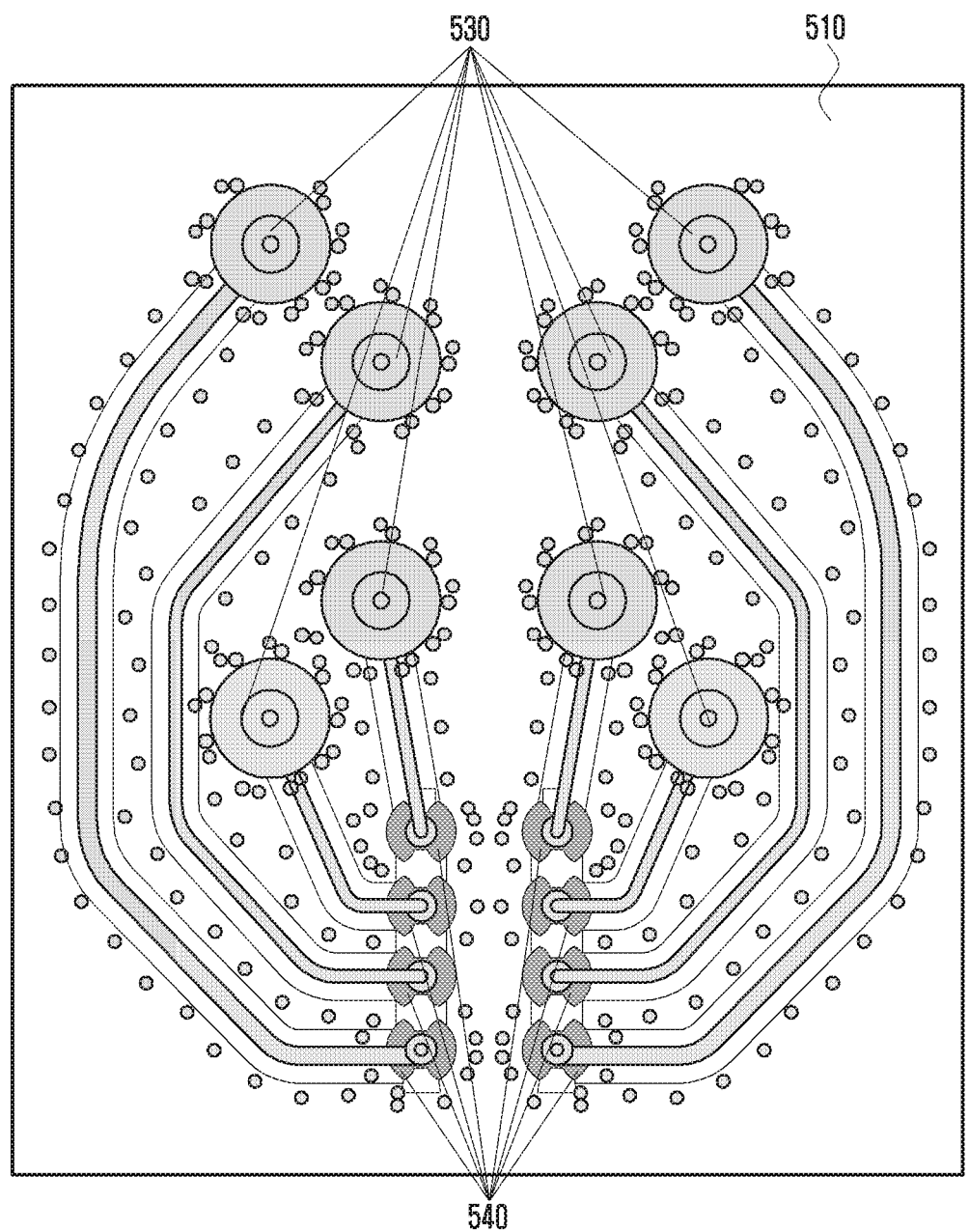
FIG. 5B is a diagram illustrating a state when viewed a first substrate layer from an upper end surface according to an embodiment of the disclosure.

FIG. 5B is a diagram illustrating a state when viewed a first substrate layer from an upper end surface according to an embodiment of the disclosure.

According to an embodiment, the first substrate layer 510 may receive an RF signal from the RF element through at least one bottom surface contact node 530 disposed at a lower end surface thereof. According to various embodiments, the RF signal received through the bottom surface contact node 530 may be transmitted to at least one top surface contact node 520 disposed at the upper end surface of the first substrate layer 510 through a wiring inside the first substrate layer 510.

According to an embodiment, the bottom surface contact node 530 may be electrically connected to the RF element through a soldering method. According to various embodiments, the top surface contact node 520 may be electrically connected to a second substrate layer disposed at the upper end surface of the first substrate layer 510 in a BGA or LGA method.

Figure 5C:
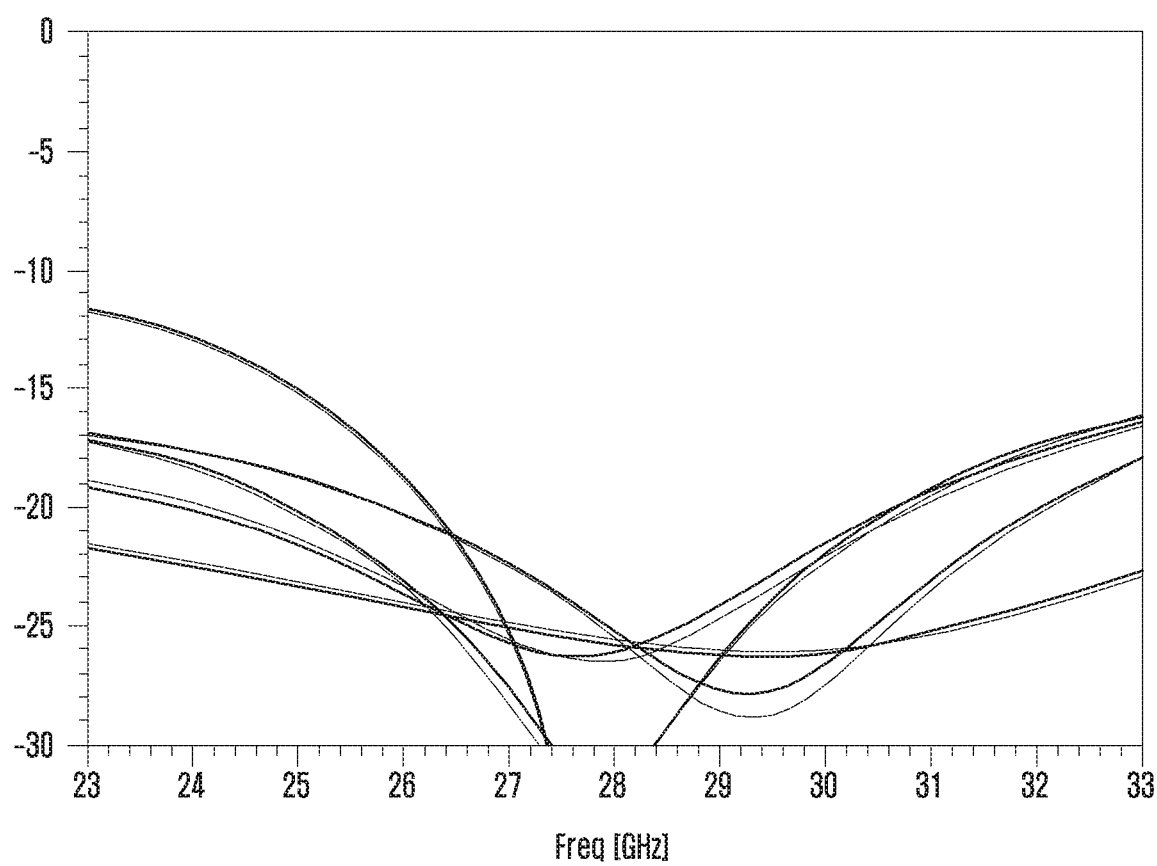
FIG. 5C is a graph illustrating a parameter s of the first substrate layer according to an embodiment of the disclosure.

FIG. 5C is a diagram illustrating a parameter s of the first substrate layer according to an embodiment of the disclosure. More specifically, FIG. 5C is a diagram illustrating a parameter $s_{11}$ of the first substrate layer. According to an embodiment, the parameter $s_{11}$ may mean a reflection loss of the received signal.

According to an embodiment, a reflection loss of a signal in a mmWave frequency band (frequency band of 23 GHz or more) may be less than −10 dB. According to various embodiments, the parameter s of the first substrate layer may be adjusted by adjusting an internal wiring of the first substrate layer. For example, a first substrate layer for emitting a beam in a 28 GHz frequency band may be generated through internal wiring adjustment.

Figure 6A:
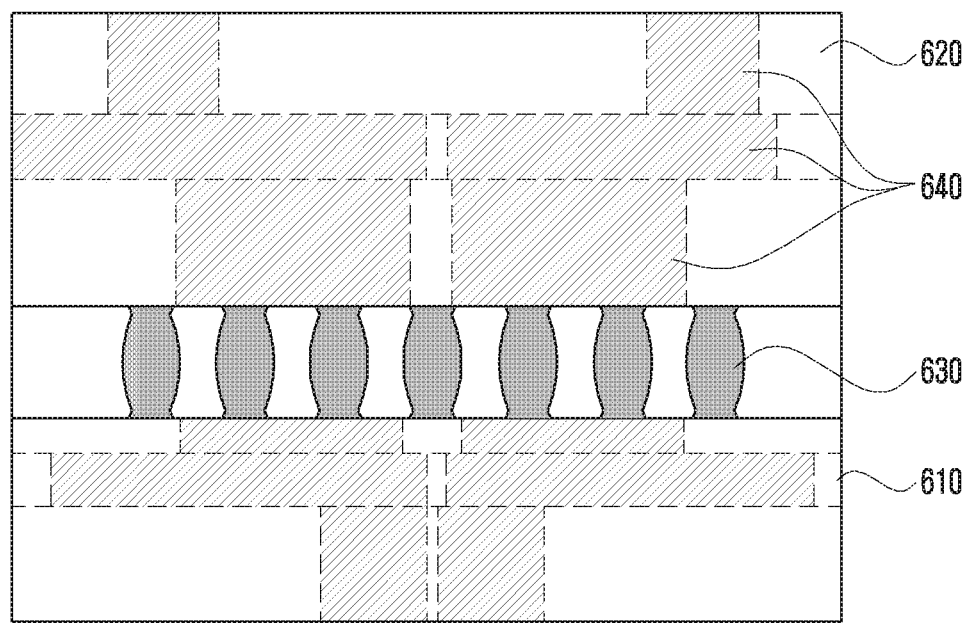
FIG. 6A is a side view of a substrate layer in which a first substrate layer and a second substrate layer are coupled according to an embodiment of the disclosure.

FIG. 6A is a side view of a substrate layer in which a first substrate layer and a second substrate layer are coupled according to an embodiment of the disclosure.

According to an embodiment, a BGA 630 or an LGA may be disposed between an upper end surface of a first substrate layer 610 and a lower end surface of a second substrate layer 620. According to various embodiments, an RF signal supplied from the RF element disposed at the lower end surface of the first substrate layer 610 may flow to the upper end surface of the first substrate layer through an internal wiring of the first substrate layer 610 and flow to the lower end surface of the second substrate layer 630 through the BGA 630 or the LGA.

According to one embodiment, a feed line 640 for transmitting the RF signal supplied to the lower end surface of the second substrate layer 630 to the upper end surface of the second substrate layer 630 may be formed inside the second substrate layer 630. According to various embodiments, the RF signal transmitted through the feed line 640 to the upper end surface of the second substrate layer 630 may be supplied to an antenna array disposed at the upper end surface of the second substrate layer 630.

Figure 6B:
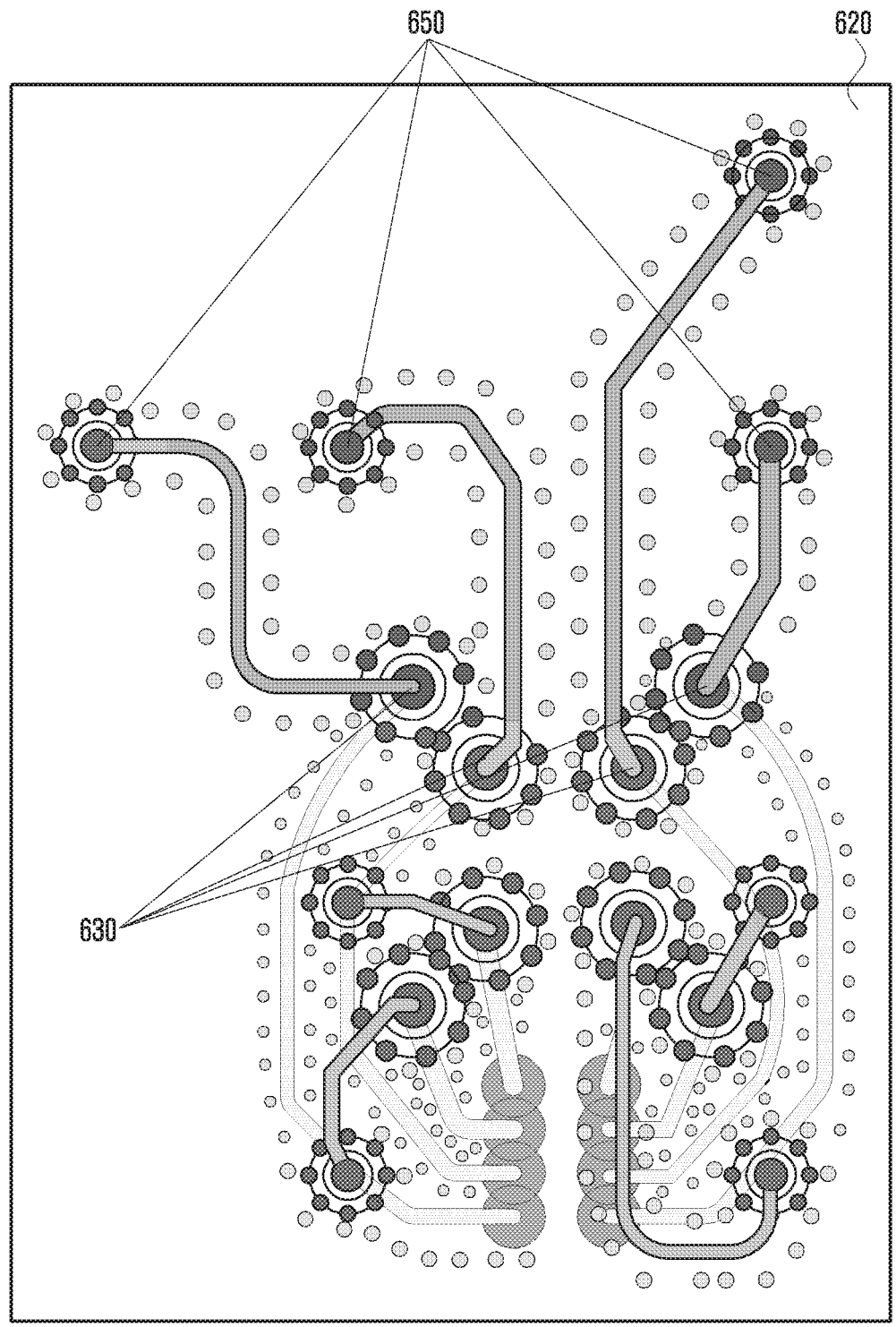
FIG. 6B is a diagram illustrating a state when viewed, from an upper end surface, a substrate layer in which a first substrate layer and a second substrate layer are coupled according to an embodiment of the disclosure.

FIG. 6B is a diagram illustrating a state when viewed, from an upper end surface, a substrate layer in which a first substrate layer and a second substrate layer are coupled according to an embodiment of the disclosure.

According to an embodiment, the second substrate layer 620 may receive an RF signal from the first substrate layer through at least one bottom surface contact node 630 disposed at the lower end surface thereof. For example, the at least one bottom surface contact node 630 may be configured with a BGA 630 or an LGA.

According to one embodiment, the RF signal received through the bottom surface contact node 630 may be transmitted to at least one top contact node 650 disposed at the upper end surface of the second substrate layer 620 through a feed line inside the second substrate layer 620. According to various embodiments, the RF signal transmitted to the upper end surface of the second substrate layer 620 through the feed line 640 may be supplied to an antenna array disposed at the upper end surface of the second substrate layer 620.

Figure 6C:
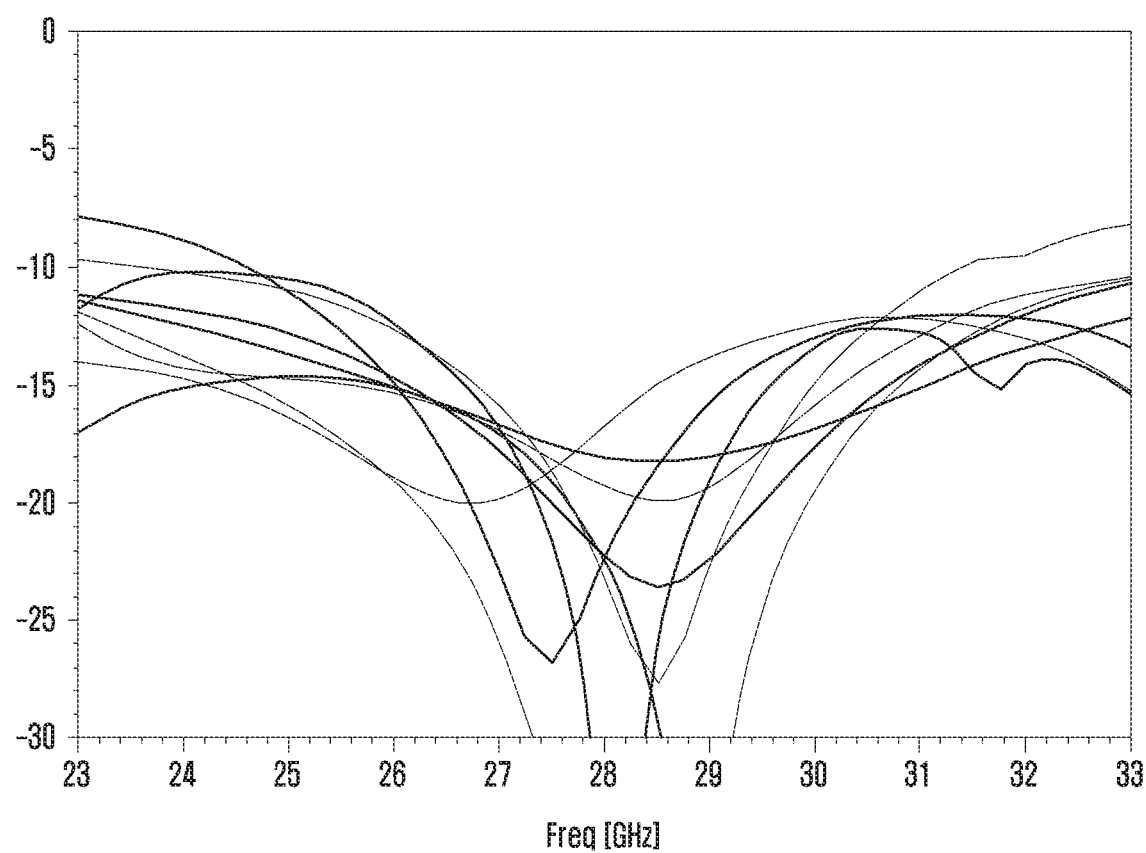
FIG. 6C is a graph illustrating a parameter s of a substrate layer in which a first substrate layer and a second substrate layer are coupled according to an embodiment of the disclosure.

FIG. 6C is a diagram illustrating a parameter s of a substrate layer in which a first substrate layer and a second substrate layer are coupled according to an embodiment of the disclosure. More specifically, FIG. 6C is a diagram illustrating a parameter $s_{11}$ of a substrate layer in which a first substrate layer and a second substrate layer are coupled. According to an embodiment, the parameter $s_{11}$ may mean a reflection loss of the received signal.

According to an embodiment, a reflection loss of a signal in the mmWave frequency band may be less than −10 dB. According to various embodiments, the parameter s of the substrate layer to which the first substrate layer and the second substrate layer are coupled may be adjusted by adjusting an internal wiring of the first substrate layer and a feeding line of the second substrate layer.

Figure 7A:
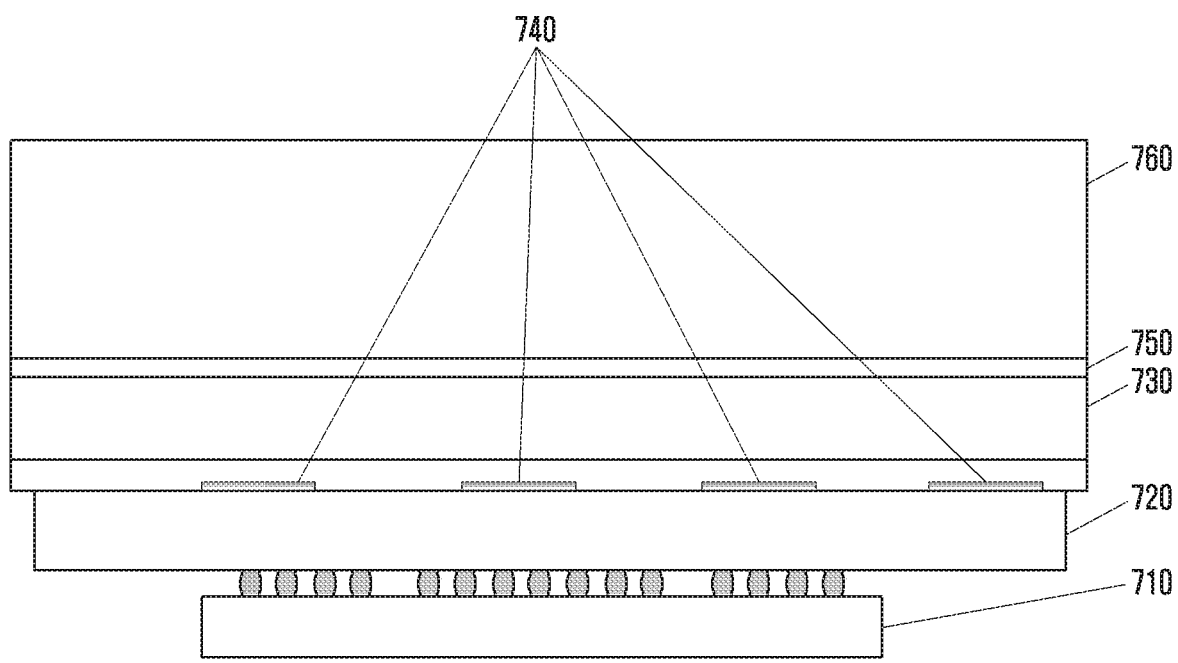
FIG. 7A is a side view of an antenna module in which a first substrate layer, a second substrate layer, and an antenna array are coupled according to an embodiment of the disclosure.

FIG. 7A is a side view of an antenna module in which a first substrate layer, a second substrate layer, and an antenna array are coupled according to an embodiment of the disclosure.

According to an embodiment, a BGA or an LGA may be disposed between an upper end surface of a first substrate layer 710 and a lower end surface of a second substrate layer 720. According to various embodiments, an RF signal supplied from the RF element disposed at a lower end surface of the first substrate layer 710 may flow to an upper end surface of the first substrate layer 710 through an internal wiring of the first substrate layer 710 and flow to the lower end surface of the second substrate layer 720 through the BGA or the LGA.

According to an embodiment, a feed line for transmitting an RF signal supplied to the lower end surface of the second substrate layer 720 to the upper end surface of the second substrate layer 720 may be formed inside the second substrate layer 720. According to various embodiments, the RF signal transmitted to the upper end surface of the second substrate layer 720 through the feed line may be supplied to an antenna array 740 disposed at the upper end surface of the second substrate layer 720.

According to an embodiment, at the upper end surface of the second substrate layer 720, a plurality of antenna arrays 740 may be disposed to perform beamforming According to various embodiments, a spacer 730 including a metallic material may be disposed at the upper end surface of an antenna array 750.

According to an embodiment, a third substrate layer 750 including an auxiliary antenna array may be disposed at an upper end surface of the spacer 730. For example, the third substrate layer 750 may be a flexible printed circuit board (FPCB). According to various embodiments, the auxiliary antenna array included in the third substrate layer 750 may improve a frequency band of the antenna module.

According to an embodiment, at an upper end surface of the third substrate layer 750, a case 760 for protecting the antenna array and the substrate layer stacked under the upper end surface of the third substrate layer 750 may be disposed. For example, the case 760 may be made of plastic. According to various embodiments, the case 760 may be a radome.

Figure 7B:
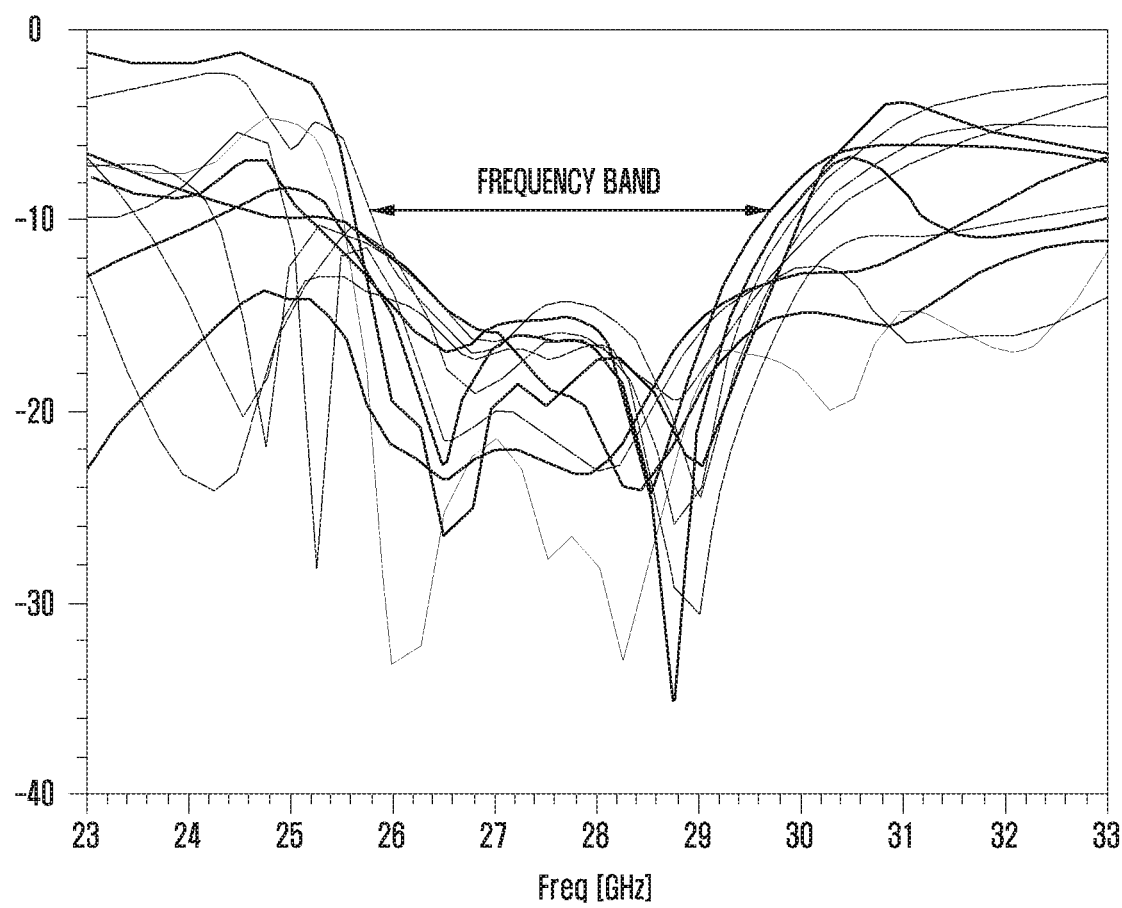
FIG. 7B is a graph illustrating a parameter s of an antenna module in which a first substrate layer, a second substrate layer, and an antenna array are coupled according to an embodiment of the disclosure.

FIG. 7B is a graph illustrating a parameter s of an antenna module in which a first substrate layer, a second substrate layer, and an antenna array are coupled according to an embodiment of the disclosure. More specifically, FIG. 7B is a diagram illustrating a parameter $s_{11}$ of a substrate layer in which a first substrate layer and a second substrate layer are coupled. According to an embodiment, the parameter $s_{11}$ may mean a reflection loss of the received signal.

According to an embodiment, a reflection loss of the signal in the mmWave frequency band may be less than −10 dB. According to various embodiments, a frequency band of the antenna module having $s_{11}$ parameter characteristics illustrated in FIG. 7B may be 26 GHz to 30 GHz.

According to an embodiment, a frequency band of the antenna module may be determined based on a size of the antenna array constituting the antenna module, a dielectric constant of a dielectric body in which the antenna array is disposed, and a length of a feed line for supplying an RF signal to the antenna array.

Figure 8:
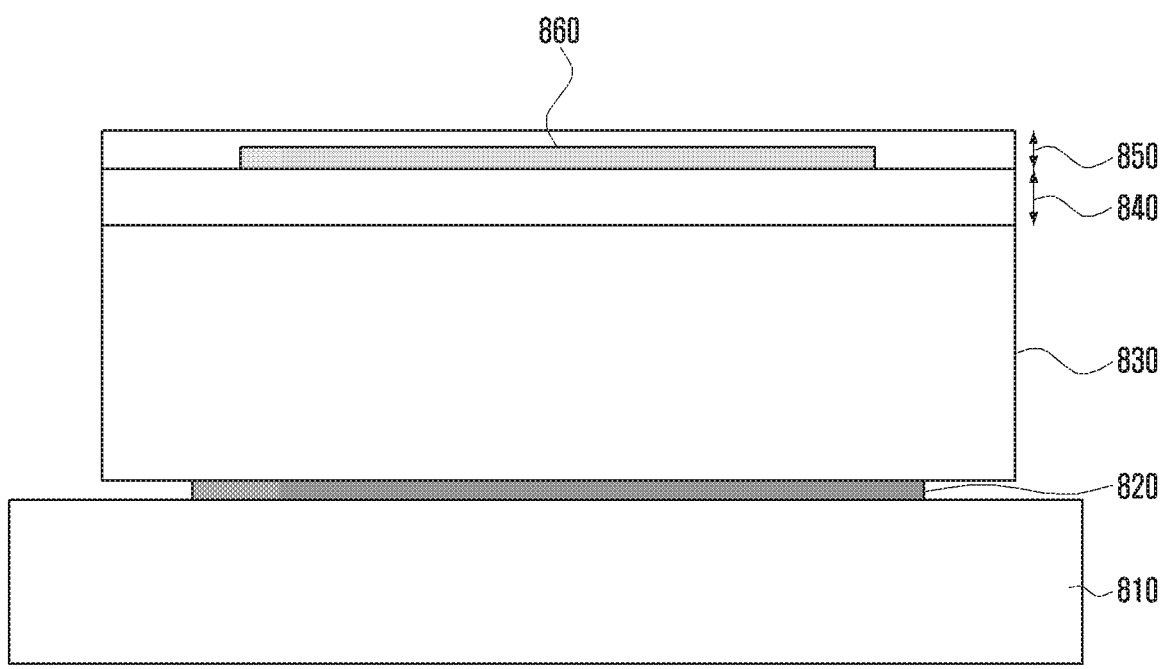
FIG. 8 is a side view illustrating an antenna module according to an embodiment of the disclosure.

FIG. 8 is a side view illustrating an antenna module according to an embodiment of the disclosure.

According to an embodiment, the antenna module may include a substrate layer 810 on which a plurality of substrates are stacked. According to various embodiments, the substrate layer 810 may be divided into a first substrate layer constituting an upper end surface thereof and a second substrate layer constituting a lower end surface thereof. For example, the first substrate layer and the second substrate layer may be electrically connected through a BGA or an LGA.

According to an embodiment, an RF element may be disposed at the lower end surface of the substrate layer 810. According to various embodiments, an RF signal supplied through the RF element may be supplied to a first antenna array 820 disposed at the upper end surface of the substrate layer 810 through an internal wiring or a feed line of the substrate layer 810. For example, the first antenna array 820 may form a beam of a specific band based on the RF signal received from the RF element.

According to an embodiment, a spacer 830 including a metallic material may be disposed at the upper end surface of the first antenna array 820, and a second antenna array 860 may be disposed at the upper end surface of the spacer 830. According to various embodiments, a separation distance between the first antenna array 820 and the second antenna array 860 may be maintained by the spacer 830. According to an embodiment, the separation distance between the first antenna array 820 and the second antenna array 860 may be determined based on a frequency band of radio waves to be radiated through the antenna module.

According to an embodiment, an adhesive region 840 may be disposed at the upper end surface of the spacer 830, and a flexible printed circuit board (FPCB) 850 may be adhered to an upper end surface of the spacer 860 by the adhesive region 840. According to various embodiments, the FPCB 850 may include at least one second antenna array 860. According to an embodiment, a frequency band of the antenna module may be improved by the second antenna array 860 included in the FPCB 850.

The embodiments of the disclosure disclosed in this specification and drawings only present a specific example in order to easily describe the technical contents according to an embodiment of the disclosure and to help an understanding of the embodiments of the disclosure, and they do not intend to limit the scope of the embodiments of the disclosure. That is, it is apparent to those skilled in the art to which other modifications based on the technical idea of the disclosure can be practiced. Further, the respective embodiment may be operated with combined, as needed. For example, portions of a first embodiment, second embodiment, and third embodiment of the disclosure may be combined to be operated in a base station and a terminal. Further, the embodiments are suggested based on an LTE system, but other modified examples based on the spirit and scope of the embodiment may be applied to other systems such as a 5G or NR system.

What is claimed is:

1. A module for use in a wireless communication apparatus for communicating with a terminal, the module comprising:
    a first printed circuit board (PCB) comprising multiple layers;
    a plurality of antennas formed with respect to a first side of the first PCB;
    a plurality of radio frequency integrated circuit (RFIC) chips; and
    a plurality of second PCBs, each of the second PCBs comprising multiple layers, wherein each of the second PCBs is configured to electrically connect a corresponding RFIC chip of the plurality of RFIC chips to a corresponding antenna set of the plurality of antennas on the first PCB,
    wherein each of the second PCBs has a smaller surface area than the first PCB and the second PCBs are spaced apart from each other,
    wherein a first side of each of the second PCBs is coupled to a second side of the first PCB opposite to the first side of the first PCB via a grid array,
    wherein a second side opposite to the first side of each of the second PCBs is coupled with a corresponding RFIC chip of the plurality of RFIC chips, and
    wherein the module is configured to operate in a multiple input multiple output (MIMO) antenna scheme.

2. The module of claim 1, wherein a set of second PCBs within the plurality of second PCBs forms a group, and each of second PCBs included in the group is spaced apart from an adjacent second PCB at a predetermined interval.

3. The module of claim 1, wherein a set of second PCBs within the plurality of second PCBs forms a group, and each of second PCBs included in the group has a substantially same surface area with respect to each other.

4. The module of claim 1, wherein each grid array for each respective second PCB is formed on the second side of the first PCB at a predetermined spacing interval from an adjacent grid array.

5. The module of claim 1, wherein each grid array, located along a side edge of the first PCB, is disposed at a predetermined distance apart from the respective side edge of the first PCB.

6. The module of claim 1,
    wherein each of grid arrays comprises a land grid array (LGA) or a ball grid array (BGA), and
    wherein each of the plurality of antennas comprises a patch antenna.

7. The module of claim 1,
    wherein a signal radiated by each antenna set of the plurality of antennas on the first PCB is transferred via a conductive line formed in a corresponding second PCB from a corresponding RFIC chip.

8. The module of claim 1, further comprising:
    a plurality of first covers, each of the first covers configured to cover each of the RFIC chips and to transfer heat therefrom,
    a thermal interface material disposed between each of the RFIC chips and each of the first covers, and
    a second cover for covering the plurality of antennas,
    wherein the plurality of first covers include a plurality of shield cans for shielding electromagnetic waves generated by the plurality of RFIC chips and the plurality of second PCBs.

9. The module of claim 1, wherein a capacitor for removing noise is mounted at the second side of each of the second PCBs.

10. The method of claim 9, wherein the capacitor comprises a surface mounted device (SMD) type capacitor.

11. A wireless communication apparatus for communicating with a terminal, the wireless communication apparatus comprising:
    a power supply;
    a DC/DC converter for converting a voltage of a power;
    a field programmable gate array (FPGA) having programmable logic circuits; and
    a module;
    wherein the module comprises:
        a first printed circuit board (PCB) comprising multiple layers;
        a plurality of antennas formed with respect to a first side of the first PCB;
        a plurality of radio frequency integrated circuit (RFIC) chips; and
        a plurality of second PCBs, each of the second PCBs comprising multiple layers, wherein each of the second PCBs is configured to electrically connect a corresponding RFIC chip of the plurality of RFIC chips to a corresponding antenna set of the plurality of antennas on the first PCB,
wherein each of the second PCBs has a smaller surface area than the first PCB and the second PCBs are spaced apart from each other,
wherein a first side of each of the second PCBs is coupled to a second side of the first PCB opposite to the first side of the first PCB via a grid array,
wherein a second side opposite to the first side of each of the second PCBs is coupled with a corresponding RFIC chip of the plurality of RFIC chips, and
wherein the module is configured to operate in a multiple input multiple output (MIMO) antenna scheme.

12. The wireless communication apparatus of claim 11, wherein a set of second PCBs within the plurality of second PCBs forms a group, and each of second PCBs included in the group is spaced apart from an adjacent second PCB at a predetermined interval.

13. The wireless communication apparatus of claim 11, wherein a set of second PCBs within the plurality of second PCBs forms a group, and each of second PCBs included in the group has a substantially same surface area with respect to each other.

14. The wireless communication apparatus of claim 11, wherein each grid array for each respective second PCB is formed on the second side of the first PCB at a predetermined spacing interval from an adjacent grid array.

15. The wireless communication apparatus of claim 11, wherein each grid array, located along a side edge of the first PCB, is disposed at a predetermined distance apart from the respective side edge of the first PCB.

16. The wireless communication apparatus of claim 11, wherein a signal radiated by each antenna set of the plurality of antennas on the first PCB is transferred via a conductive line formed in a corresponding second PCB from a corresponding RFIC chip.

17. The wireless communication apparatus of claim 11, wherein the module further comprises:
a plurality of first covers, each of the first covers configured to cover each of the RFIC chips and to transfer heat therefrom,
a thermal interface material disposed between each of the RFIC chips and each of the first covers, and
a second cover for covering the plurality of antennas,
wherein the plurality of first covers include a plurality of shield cans for shielding electromagnetic waves generated by the plurality of RFIC chips and the plurality of second PCBs.

18. The wireless communication apparatus of claim 11, wherein a capacitor for removing noise is mounted at the second side of each of the second PCBs, and
wherein the capacitor comprises a surface mounted device (SMD) type capacitor.

19. A module for use in a wireless communication apparatus for communicating with a terminal, the module comprising:
a first printed circuit board (PCB) comprising multiple substrate layers;
a plurality of antennas formed with respect to a first side of the first PCB;
a plurality of radio frequency integrated circuit (RFIC) chips; and
a plurality of second PCBs, each of the second PCBs comprising multiple substrate layers, wherein each of the second PCBs is configured to electrically connect a corresponding RFIC chip of the plurality of RFIC chips to corresponding antennas,
wherein a number of the corresponding antennas electrically connected to each of the second PCBs is smaller than a total number of the plurality of antennas,
wherein each of the second PCBs has a smaller surface area than the first PCB and the second PCBs are spaced apart from each other,
wherein a first side of each of the second PCBs is coupled to a second side of the first PCB opposite to the first side of the first PCB via a grid array,
wherein a second side opposite to the first side of each of the second PCBs is coupled with a corresponding RFIC chip of the plurality of RFIC chips, and
wherein the module is configured to operate in a multiple input multiple output (MIMO) antenna scheme.

20. The module of claim 19, wherein a number of the corresponding antennas electrically connected to each of the second PCBs equals a total number of the plurality of antennas divided by a total number of the second PCBs.

* * * * *